(12) United States Patent
Schoefthaler et al.

(10) Patent No.: US 6,462,566 B1
(45) Date of Patent: Oct. 8, 2002

(54) SENSOR ELEMENT

(75) Inventors: Martin Schoefthaler; Ralf Schellin, both of Reutlingen (DE); Bernd Maihoefer, Simpsonville, SC (US); Franz Laermer, Weil der Stadt (DE); Markus Lutz, Sunnyvale, CA (US); Harald Emmerich; Joerg Kaienburg, both of Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/508,559
(22) PCT Filed: Oct. 9, 1998
(86) PCT No.: PCT/DE98/02672
 § 371 (c)(1),
 (2), (4) Date: Aug. 16, 2000
(87) PCT Pub. No.: WO99/14613
 PCT Pub. Date: Mar. 25, 1999

(30) Foreign Application Priority Data

Sep. 12, 1997 (DE) .......................................... 197 40 049

(51) Int. Cl.[7] .......................................... G01R 31/302
(52) U.S. Cl. .......................................... 324/750
(58) Field of Search .......................... 324/750, 117 R, 324/117 H, 244, 246, 249, 256, 257, 259, 260, 261, 262, 263; 361/267

(56) References Cited

U.S. PATENT DOCUMENTS

| 4,680,544 | A | * | 7/1987 | Rudolf ........................ 324/259 |
| 5,731,703 | A | | 3/1998 | Weinberg et al. |
| 5,798,641 | A | * | 8/1998 | Spagna et al. ............... 324/228 |
| 5,818,227 | A | * | 10/1998 | Payne et al. ................. 324/259 |

FOREIGN PATENT DOCUMENTS

| CH | 679 341 | 1/1992 |
| EP | 0 392 945 | 10/1990 |
| GB | 2 136 581 | 9/1984 |

* cited by examiner

Primary Examiner—N. Le
Assistant Examiner—Etienne LeRoux
(74) Attorney, Agent, or Firm—Kenyon & Kenyon

(57) ABSTRACT

A sensor element, in particular for determining an angle of rotation, has a detection medium whose position varies as a function of a change in a parameter to be measured, where the change in the position of the detection medium leads to a change in an analyzable signal of the sensor element which is influenced by the detection medium. The detection medium has at least one conductor loop carrying current which is exposed to an external magnetic field; the detection medium is rotationally movably mounted so that a rotational motion of the sensor element about an angle of rotation in the plane of the magnetic field is converted into a deflection of the detection medium perpendicular to the magnetic field.

19 Claims, 7 Drawing Sheets

SENSOR ELEMENT

FIELD OF THE INVENTION

The present invention relates to a sensor element, in particular for determining an angle of rotation, having a detection medium whose position varies as a function of a change in a parameter to be measured, where the change in the position of the detection medium leads to a change in an analyzable signal of the sensor element which is influenced by the detection medium.

BACKGROUND INFORMATION

A previously proposed sensor element, for example, operates according to a potentiometric or optical principle are known in precision mechanics. Due to a rotational motion of a part having this sensor element, a change in resistance is triggered, leading to a change in an analyzable electric signal, or in the case of sensor elements that function optically, an optical signal is influenced as a function of a rotational position, so that it generates an analyzable signal, e.g., by way of a photoelectric cell. In addition, Hall sensors are also known, which utilize the effect that, in the case of a current-carrying conductor with current flow perpendicular to a homogeneous magnetic field, a voltage difference can be picked up perpendicular to the current flow and perpendicular to the magnetic field. A disadvantage of the previously proposed sensor elements is that they have a relatively complicated design, and consequently only a limited reduction in their size is possible.

SUMMARY OF THE INVENTION

The sensor element according the present invention offers the advantage that it has a simple design and can detect a change in the angle of rotation with a high sensitivity. It is possible to achieve transformation of the angle of rotation very advantageously into a force which can be analyzed as the degree of the angle of rotation due to the fact that the detection medium has at least one current-carrying conductor loop which is exposed to an external magnetic field, preferably homogeneous or having a preferred direction, and the detection medium is rotationally movably mounted so that a rotational motion of the detection medium about an angle of rotation in the plane of the magnetic field is converted into a deflection of the detection medium perpendicular to the magnetic field. It is thus easy to perform a non-contact measurement of an angle of rotation. In particular when the sensor element is produced by using surface micromechanics, e.g., on a wafer having an integrated circuit, high-precision sensor elements which are extremely small and lightweight can be manufactured in a manner suitable for mass production. Thus, these sensor elements can also be arranged on sensitive parts where a change in their angle of rotation is to be detected.

This sensor element is suitable not only for detecting a change in the angle of rotation but also for detecting an angle of rotation which may remain unchanged for a very long period of time.

In a preferred embodiment of the present invention, the sensor element has two detection media arranged so they are rotated 90° relative to one another. This permits complete detection of the angle of rotation over 360° in a very advantageous manner. At the same time, overtwisting, i.e., repeatedly rotating a full 360° C., is also possible without the sensor striking a mechanical stop or the like.

In a further preferred embodiment of the present invention, the detection medium is a torsion structure which can be twisted about a fixed axis. An external angle of rotation or a change in an external angle of rotation can thus be transformed into an internal torsion angle or a change in an internal torsion angle. The internal torsion angle or the change in internal torsion angle can preferably be detected by a differential capacitance measurement based on the fact that a change in a torsion angle leads to a change in an electric signal influenced by a capacitance.

DETAILED DESCRIPTION

Description of the Embodiment

Figure 1:
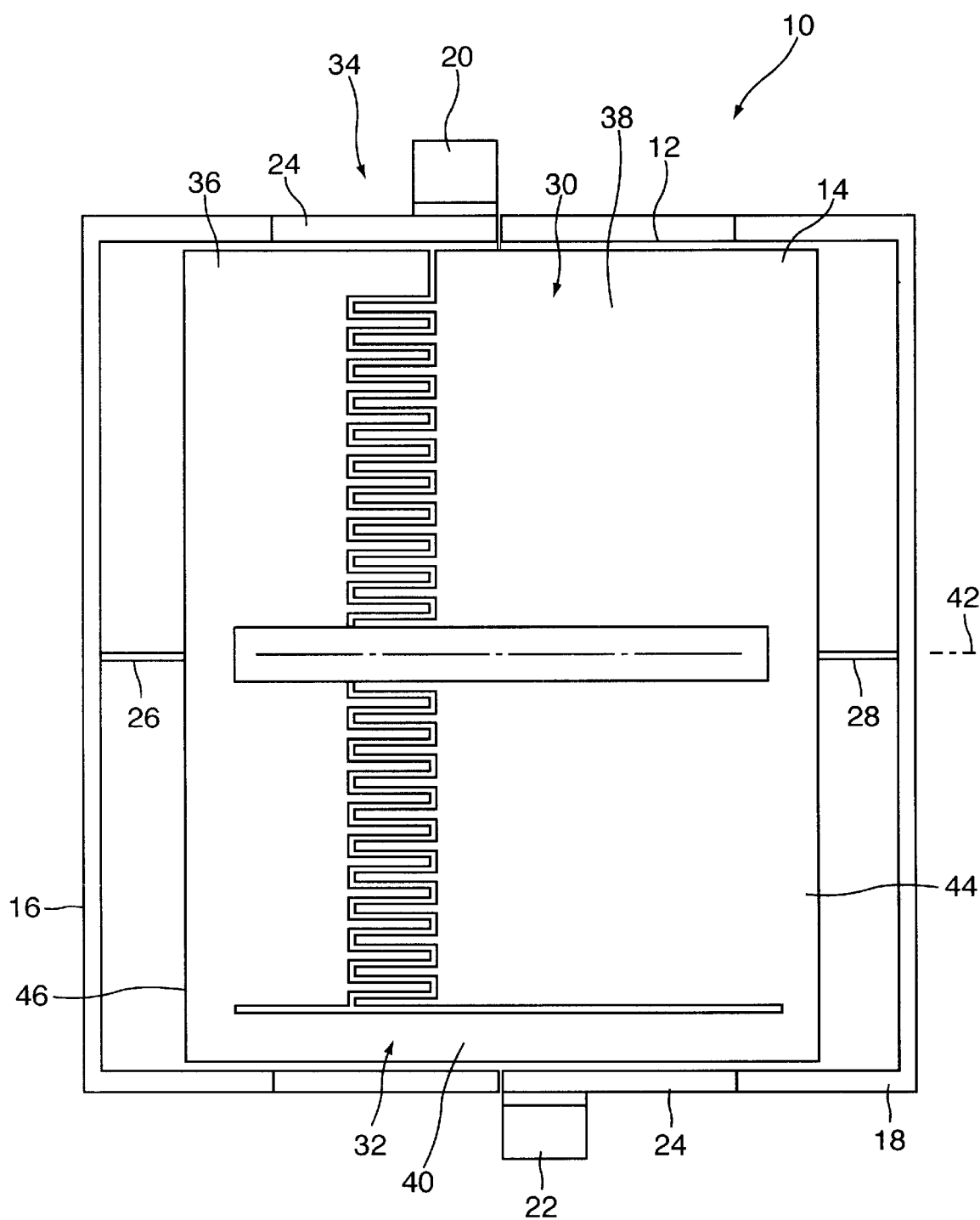
FIG. 1 shows a top view of a sensor element in a first variant of an embodiment according to the present invention.

FIG. 1 shows a top view of a sensor element 10. Sensor element 10 is structured on the surface of a wafer (not shown) by the methods of surface micromechanics. The wafer may at the same time have electric circuits for analysis of signals supplied with sensor element 10. These analyzer circuits will not be described in greater detail in the context of the present description.

Silicon may be used as the material for sensor element 10, with electric conductivity of sensor element 10 being achieved by suitable doping.

Sensor element 10 has a frame 12 surrounding a detection medium 14 as seen from above. The frame is designed in two parts, resulting in a left frame half 16 and a right frame half 18, as seen in the top view illustrated in FIG. 1. Frame half 16 is connected to a terminal contact 20 and frame half 18 is connected to a terminal contact 22. Frame halves 16 and 18 have sections 24 having a greater width and thus a larger cross section than the other parts of frame halves 16 and 18, thus permitting a reduction in the electric resistance of the entire frame half 16 and 18 and guaranteeing reliable anchoring of frame 12.

Detection medium 14 is formed by a flat wafer whose specific design is explained below. Detection medium 14 is suspended freely on frame halves 16 and 18 by torsion bars 26 and 28; in other words, it does not come into contact with the wafer of sensor element 10. The distribution of component masses on both sides of torsion axis 42 is symmetrical, so that when there is no force acting on it, detection medium 14 is the same distance from the wafer of sensor element 10 located underneath over its entire area. Torsion bars 26 and 28 have a relatively great depth (as seen into the plane of the paper in FIG. 1) in relation to their width as seen in the top view. Due to this relationship of width to depth of torsion bars 26 and 28, detection medium 14 is suspended as a freely oscillating rocker between frame halves 16 and 18 as seen in the plane of the paper. At the same time, detection medium 14 is suspended in a stable position with respect to the weight forces and accelerations parallel to the z axis.

Detection medium 14 has finger structures 30 and 32 which are symmetrical on both sides of its torsion axis 42 passing through torsion bars 26 and 28. Finger structures 30 and 32 are designed so that they form alternatively overlapping fingers along an imaginary dividing joint 34 between a left half 36 of the detection medium and a right half 38 of detection medium 14 as seen from above. Dividing joint 34 does not extend over the entire length of detection medium 14, but instead leaves a continuous bar 40 (seen at the bottom of FIG. 1). Bar 40 runs parallel to torsion axis 42 which passes through torsion bars 26 and 28 and is mechanically and electrically coupled to torsion bars 26 and 28 by rocker bars 44 and 46.

Figure 6:
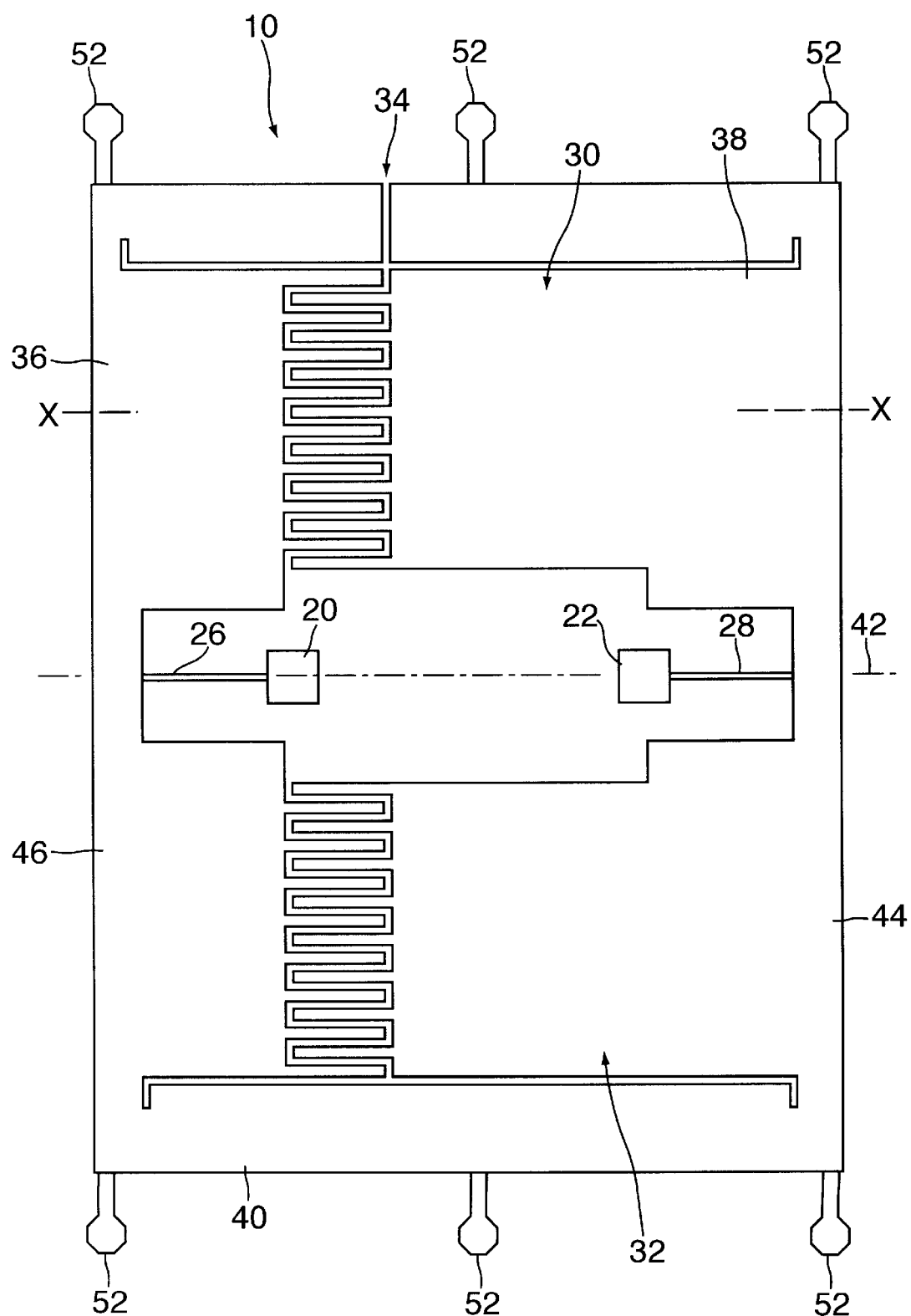
FIG. 6 shows a top view of a sensor element in a second variant of an embodiment according to the present invention.

Another embodiment of sensor element 10 is shown in FIG. 6. The same parts as in FIG. 1 are labeled with the same reference numbers and are not explained again. Sensor element 10 shown in FIG. 6 differs from that in FIG. 1 in that detection medium 14 is suspended over torsion bars 26 and 28 which point inward instead of being suspended by frame 12. The torsion bars are hinge-connected at fastening points, at the same time creating electric terminal contacts 20 and 22. The remaining design corresponds to that of sensor element 10 illustrated in FIG. 1. The functioning of the two variants of sensor element 10 according to FIGS. 1 and 6 is the same, so it is explained below only on the basis of one embodiment. Suspending detection medium 14 over torsion bars 26 and 28 which point inward yields in particular compensation of internal, material-specific compressive loads on sensor element 10 without any impairment of the function to be explained below. In addition, a reduction in the electric resistance of sensor element 10 is also possible.

In addition to the embodiment illustrated in FIG. 1, projections 52, which are symmetrical with torsion axis 42, extend away from detection medium 14. These projections 52 offer the advantage explained on the basis of FIGS. 7 and 8.

Figure 2:
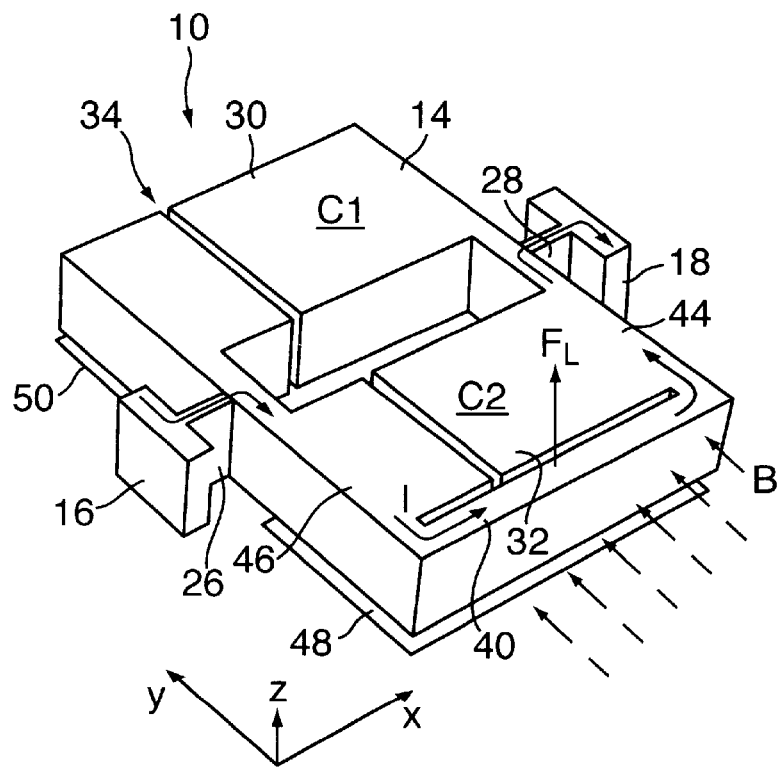
FIG. 2 shows a schematic perspective view of a sensor element according to FIG. 1.

FIG. 2 shows sensor element 10 in a schematic perspective view, where the same parts as in FIG. 1 are labeled with the same reference numbers and are not explained again. The functioning of sensor element 10 is to be illustrated on the basis of this perspective view, with the functioning also applying to sensor element 10 of FIG. 6 accordingly.

Terminal contacts 20 and 22 are connected to a circuit configuration (not shown) so that a current I flows between terminal contacts 20 and 22. Due to the design of sensor element 10, in particular of detection medium 14, current I flows between terminal contacts 20 and 22 over frame half 16, torsion bar 26, rocker bar 46, bar 40, wiper bar 44, torsion bar 28 and frame half 18, as indicated with the arrows in FIG. 2. This path is predetermined for current I due to the design of dividing joint 34, torsion bars 26 and 38 and frame halves 16 and 18. Sensor element 10 is exposed at the same time to a constant homogeneous magnetic field B, ideally assumed to be unidirectional. The action of magnetic field B may be produced, for example, by a permanent magnet assigned to sensor element 10, a switchable electromagnet or in some other way.

According to the known physical relationships, a force known as Lorenz force FL is exerted on a moving electric charge in a magnetic field. In the example illustrated in FIG. 2, current I flows in direction x and is acted upon by magnetic field B in direction y, resulting in Lorenz force FL in direction z. The following relationship holds:

$$F_L = l * \|\vec{I} \times \vec{B}\| = l * I * B * \sin \alpha$$

where l is the length of bar 40, I is the current flowing through bar 40, B is the magnetic field acting on bar 40 and α is an angle of rotation to be explained below.

On the basis of this relationship, detection medium 14 undergoes a deflection about its torsion axis 42, so that detection medium 40 is deflected by an angle θ to the surface of the wafer beneath detection medium 14. Due to the rocker-like suspension of detection medium 14 over torsion bars 26 and 28 on frame 12, this results in an alternating approach and withdrawal of detection medium 14 relative to the surface of the wafer.

The degree of the deflection of detection medium 14 and thus the size of angle θ is determined by Lorenz force FL occurring along bar 40. The Lorenz forces also occurring on rocker bars 46 and 44 mutually cancel one another out because the direction of current I through rocker bars 44 and 46 is exactly opposite.

On the basis of this relationship, it is clear that the size of Lorenz force FL is determined by the size of current I, the size of magnetic field B and the angle of rotation α. Since current I and magnetic field B are constant, Lorenz force FL varies only on the basis of a change in the angle of rotation α.

Figure 3:
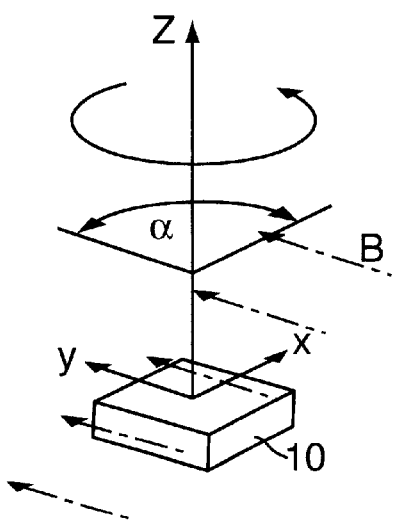
FIG. 3 show a first schematic view of the mechanism of operation of the sensor element.

Sensor element 10 is indicated schematically in FIG. 3, where sensor element 10 can rotate about the z axis in an angular rotation α. Lorenz force FL changes in proportion to sin(α) with a change in the angle of rotation α because detection medium 14 and thus bar 40 are also rotated at the same time with sensor element 10. Angle of rotation α is transferred by the rotation of sensor element 10 to a change in the direction of flow of current I to magnetic field B. The rotation of bar 40, which is proportional to the change in angle of rotation α, leads to a change in Lorenz force FL in proportion to sin(α). According to the change in Lorenz force FL, detection medium 14 experiences a change in deflection about torsion axis 42 by angle θ.

Figure 4:
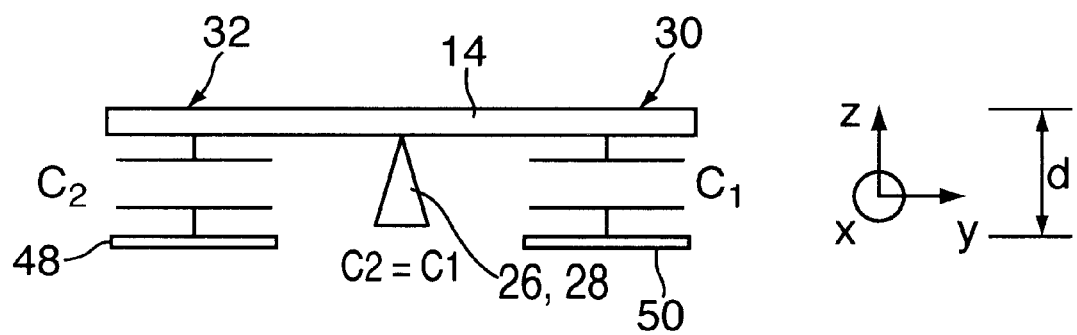
FIG. 4 shows a second schematic view of the mechanism of operation of the sensor element.
Figure 5:
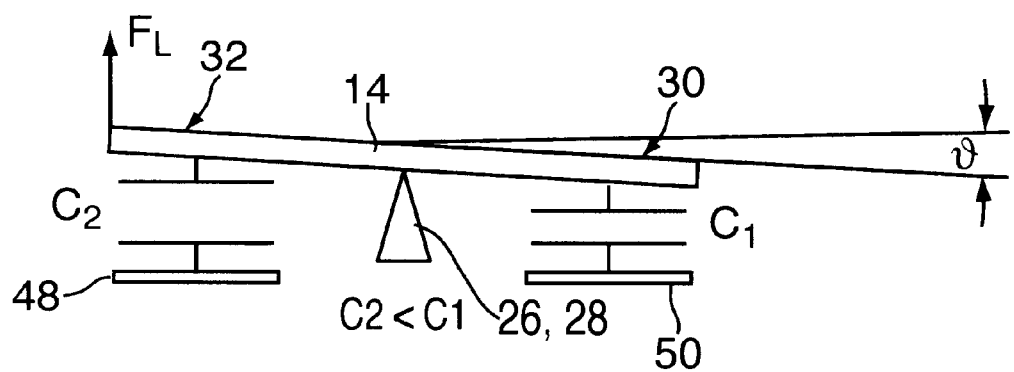
FIG. 5 shows a third schematic view of the mechanism of operation of the sensor element.

The change in angle θ as a measure of a change in the angle of rotation α can be detected on the basis of the design of sensor element 10 illustrated in FIGS. 4 and 5. Electrodes 48 and 50, each of which may be made of a buried polysilicon, for example, are arranged beneath detection medium 14. Electrodes 48 and 50 form counter-electrodes for finger structures 30 and 32, resulting in the development of a capacitance C2 between finger structure 32 and electrode 48 and a capacitance C1 between figure structure 30 and electrode 50. The size of capacitances C1 and C2 is determined by the distance between finger structures 30 and 32 relative to electrodes 50 and 48, respectively, and the area of the electrodes. Due to the design of finger structures 30 and 32 along dividing joint 30, there is a relatively homogeneous area A despite the design of the design of dividing joint 34 which establishes the path of current I over bar 40.

The asymmetrical arrangement of dividing joint 34 (as seen from above) compensates for the difference in electrostatic attractive forces based on different potential differences between the individual fingers of finger structures 30 and 32, because the reciprocal area ratio enters into the electrostatic attractive force.

FIG. 4 shows sensor element 10 in the "off" position, i.e., current I is not flowing. Therefore, no Lorenz force FL develops due to applied magnetic field B. Detection medium 14 is thus in an equilibrium position, so that distances d from electrodes 48 and 50 to finger structures 32 and 30, respectively, are equal. Capacitances C1 and C2 are thus also equal, and the following equation holds:

$$C_i = \varepsilon_o \varepsilon_r \frac{A}{d_i}$$

where $\varepsilon_r$ is a dielectric constant.

If current I (FIG. 2) flows through bar 40, Lorenz force FL is acting, and detection medium 14 is brought out of its equilibrium position. According to the size of Lorenz force FL, there is a deflection by angle θ. This yields a difference between capacitances C1 and C2 because while distance d between electrode 48 and finger structure 32 increases, distance d between electrode 50 and finger structure 30 decreases. The resulting differential capacitance is a signal which depends on Lorenz force FL because of the dimensions of sensor element 10, amperage I and magnetic field B.

Now if there is a change in angle of rotation α, the change in Lorenz force FL mentioned above also occurs and thus there is a change in angle θ. With a change in angle θ, a new differential capacitance is established between capacitors C1 and C2 and can be measured by using an analyzer circuit. The resulting differential capacitance or change in differential capacitance thus depends on angle of rotation α or a change in angle of rotation α.

Thus, on the whole, a sensor element 10 having a simple design is created, where an external change in angle of rotation α can be transformed into an internal change in angle θ with a very high sensitivity; in other words, even extremely minor changes in angle of rotation α can be detected reliably.

The preceding description has assumed a constant magnetic field and/or a constant current flow, so that the angle of rotation was then the only variable. To increase measurement accuracy, however, it is also possible to use a dynamic measurement, where either the current flow or the magnetic field is varied. Torsion bars 26, 28 with weights attached to them form a vibrating structure having an inherent mechanical oscillation. If the Lorenz force is now varied at a frequency close to that of the inherent mechanical oscillation of the system of torsion springs and attached weights, the mechanical structure is excited to an extremely great deflection, i.e., very great rotational oscillation about axis 42. Since angle of rotation α is to be measured here, such a variation in the Lorenz force over time can be achieved by influencing either magnetic field B or current I. The detection media then execute vibrations with a large amplitude which can be detected especially well and easily. Even minor variations in angle of rotation α then cause a great change in this oscillation, resulting in a considerable increase in sensitivity. This is the case in particular when the sensor element is arranged in a housing in which the internal pressure is reduced, so that damping of the oscillations of the sensor element is minor.

Due to the dynamic excitation of the sensor element, however, the detectable angle range of each sensor element is limited to 90°. To perform a complete 360° measurement with high precision, four sensor elements are used. Of these, two are operated in a quasi-static manner, thus permitting detection over a full 360°. The high angle resolution is then achieved by the two additional dynamically operated sensors.

Figure 7:
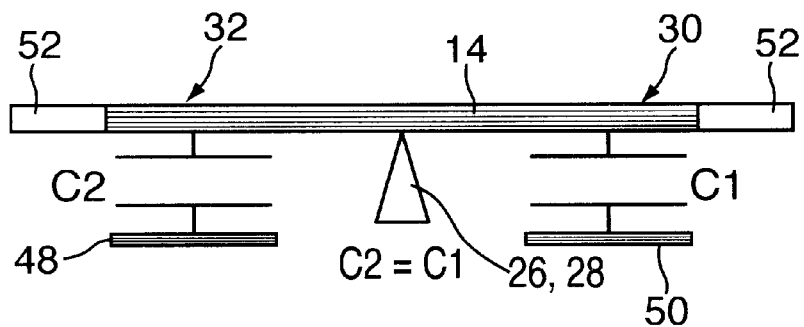
FIG. 7 shows a first additional variant of the sensor element according to the present invention.
Figure 8:
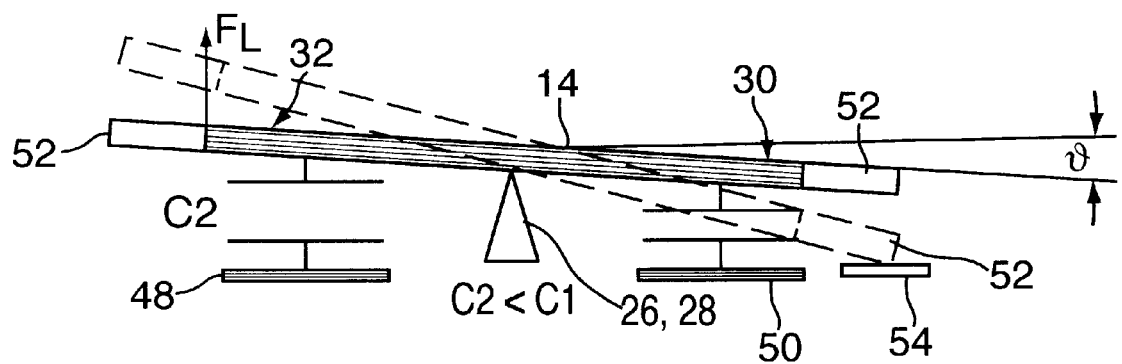
FIG. 8 shows a second additional variant of the sensor element according to the present invention.

The function of projections 52 is illustrated on the basis of FIGS. 7 and 8. They are designed in one piece with detection medium 14 and can be subjected to rotation together with it about torsion axis 42. For example, if there is a very large deflection of detection medium 14 due to accelerated rotation about torsion axis 42, projections 52 prevent this from resulting in direct electric contact, which would thus cause a short-circuit between electrode pairs 30 and 50 or 32 and 48, respectively. On the basis of the great deflection of detection medium 14 illustrated with dotted lines in FIG. 8, this shows that before direct contact can occur between electrode pair 30 and 50, projection 52 comes to rest against a stop 54 thus limiting the maximum deflection of the detection medium. Projections 52 thus function as a mechanical overload protection of sensor element 10. Stops 54 may be made of the same material as electrodes 48 and 50, for example, and they may be located at the same level with them. However, there is no electrically conducting connection between electrodes 48 and 50 and stops 54.

Due to the design of sensor element 10, it may also be used in moving systems such as motor vehicles, because forces of acceleration acting on the system have no effect on the signals detecting the change in angle of rotation α. An acceleration in direction z has a uniform effect on entire detection medium 14, so it does not cause any deflection about torsion axis 42. Forces of acceleration acting in directions x and y also do not cause any signal distortion because there is no change in distance d between electrodes 48 and 50 and comb structures 32 and 30 because of the action of such acceleration forces. Any cross sensitivities occurring here due to a slight parallel displacement of detection medium 14 can be disregarded. Through appropriate control of detection medium 14, it is possible to eliminate sensitivity to rotational acceleration when the axis of rotation coincides with the torsion axis or at least has a component parallel to this torsion axis.

Thus, it is possible to achieve different sensitivities on the whole by varying the dimensions of the individual components of sensor element 10. Thus, a change in length, width or thickness of torsion bars 26 and 28, for example, can lead to a change in deflection by angle θ at the same Lorenz force FL. This is also true of the dimensions of detection medium 14 or an increase or decrease in amperage of current I or magnetic field B. A change in frame 12 does not have any direct effect on the sensitivity of sensor element 10, but it may influence its stability. In particular through controlled undercutting of frame halves 16 and/or 18, it is possible to achieve an increase or decrease in compensation of compressive stresses acting on frame 12 over torsion bars 26 and/or 28.

According to another embodiment (not shown here), sensor element 10 may have a total of two detection media 14 arranged so they are rotated exactly 90° relative to one another. This permits detection of a change in angle of rotation α beyond 180°. According to the changes in direction of current flow I in the individual detection media relative to magnetic field B which remains constant, this yields different deflections of individual detection media 14 each by an angle θ which can be detected accurately by measuring the differential capacitances and which can be assigned to a corresponding change in angle of rotation α.

Overtwisting of one part having sensor element 10 beyond 360° can thus be detected reliably, so it is possible to turn repeatedly a full 360° without the sensor striking a mechanical stop or a similar stop.

In addition to detection of an angle of rotation α or a change in angle of rotation α, sensor element 10 may also be used in the reversed mode of detection of a magnetic field B. When angle α is known and the amperage of current I is known, it is possible to deduce the size of a magnetic field B by inverting the equation given above for Lorenz force FL. A change caused by magnetic field B in this case or the occurrence of Lorenz force FL also lead to a change in differential capacitances between capacitors C1 and C2.

Figure 9:
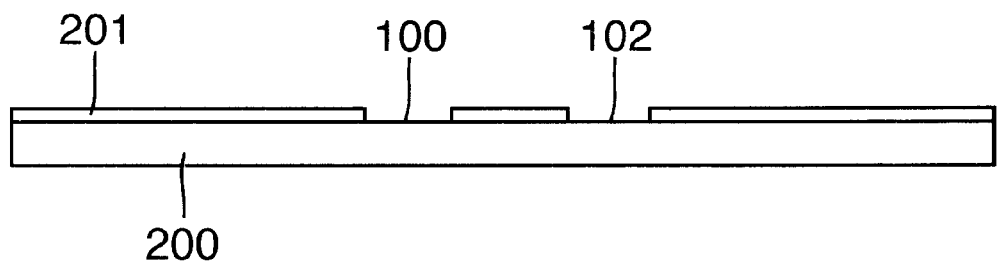
FIG. 9 shows a first illustration of the manner according to which the sensor element of the present invention is produced.

The method of producing the sensors will now be explained in greater detail on the basis of FIGS. 9 through 11. FIG. 9 shows a substrate 200 to which is applied a sacrificial layer 201. Recesses 100 and 102 are introduced into this sacrificial layer, exposing substrate 200. In the remaining course of the process, the sensor element is mounted directly on substrate 200 within these recesses 100 and 102. All the usual substrate materials such as silicon wafers, ceramic plates or the like are suitable for substrate 200. Metal plates provided with a layer of insulation on the surface may also be used. The top layer of substrate plate 200 is an insulating layer. Sacrificial layer 201 may be made of any materials that can be removed selectively with respect to other materials of which the sensor element is then made. The sacrificial layer is generally removed by etching, e.g., through the use of liquid etchants or gaseous etching media.

In another step, the sensor structure is then applied to substrate plate 200 and sacrificial layer 201. Various methods are conceivable. First, a whole-area coating may be applied with a material for the sensor structure which is then structured by the usual structuring methods, such as covering it with a mask and etching away the unmasked areas. As an alternative, it is also possible to apply a thick coating in which openings may be created that extend to sacrificial layer 201 or as far as substrate plate 200 in the area of recesses 100 and 102. The recesses represent a form for the sensor structure to be created. This form is then filled with a metal or the like by a galvanic process, for example, and next the thick forming layer is removed. FIG. 10 illustrates the result of these two different production methods. FIG. 10 shows in cross section a process step in the production of a sensor like that illustrated in FIG. 6. The cross section in FIG. 10 corresponds to a cross section along axis of rotation 42 illustrated in FIG. 6. In the area of recesses 100 and 102, terminal contacts 20 and 22 were produced and fixedly connected to substrate 200. Torsion bars 26, 28 are connected to these terminal contacts 20, 22 but they do not have any direct contact with substrate 200; instead, they rest completely on sacrificial layer 201. Then left and right sides 36, 38 of the detection medium are attached to torsion bars 26, 28, respectively. These left and right sides 36, 38 of the detection medium also rest completely on sacrificial layer 201 and do not have any direct contact with substrate 200. Then the structure illustrated in FIG. 11 is created by etching sacrificial layer 201. The view in FIG. 11 corresponds to a section through the sensor element in FIG. 6 along axis 42. Terminal contacts 20, 22 are connected directly to substrate 200. Torsion bars 26, 28 are connected to them, and left and right sides 36, 38 of the detection medium are attached to the torsion bars. As shown clearly in the cross section in FIG. 11, a fixed connection to substrate 200 is guaranteed by terminal contacts 20, 22, while torsion bars 26, 28 and the left and right sides of analyzer arrangements 36, 38 are freely movable with respect to substrate 200.

Figure 10:
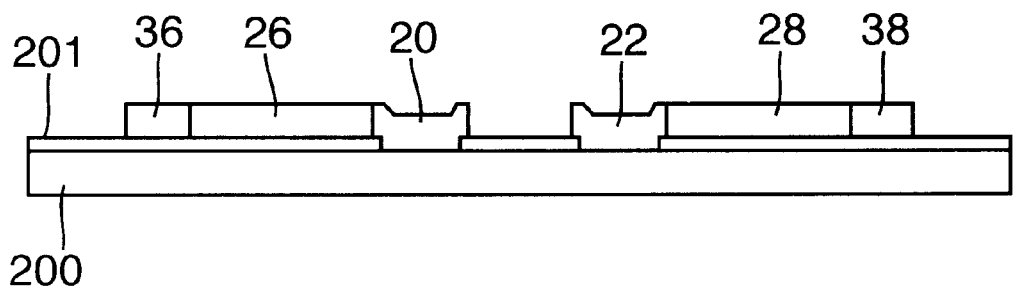
FIG. 10 shows a second illustration of the manner according to which the sensor element of the present invention is produced.
Figure 11:
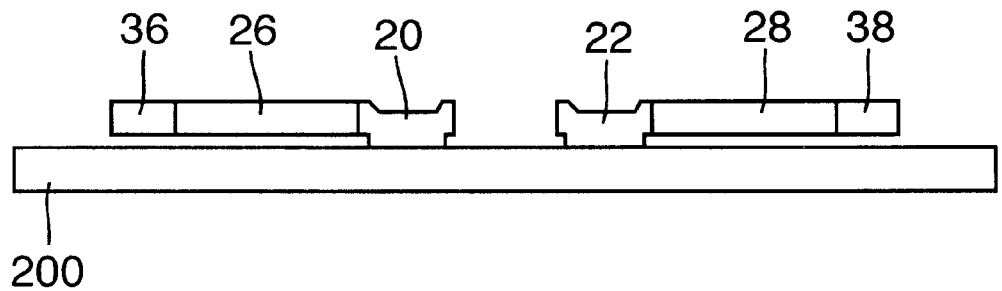
FIG. 11 shows a third illustration of the manner according to which the sensor element of the present invention is produced.

The process steps in FIGS. 9 through 11 represent the usual process steps in surface micromechanics. It is advantageous that a plurality of sensors can be produced on one substrate at the same time with this method. The detection element here is designed as a plate-like element which is held a slight distance from the substrate by terminal contacts 20, 22 designed as a socket or a base. The plate-like analyzer arrangements together with the suspension on torsion bars 26, 28 forms a rocker structure where the distance of each side of the rocker from the substrate can change due to the forces acting on it. In the present case, the forces are formed by a Lorenz force, i.e., a force acting between a current-carrying conductor and a magnetic field. To produce the Lorenz force, the plate-like analyzer element is divided by appropriate dividing joints so that a defined current-carrying conductor loop is formed when there is a potential difference between the two terminal contacts. The deflection of the analyzer arrangements is then detected, for example, by electrodes applied to the substrate, forming plate capacitors together with each side of the analyzer arrangements.

Figure 12:
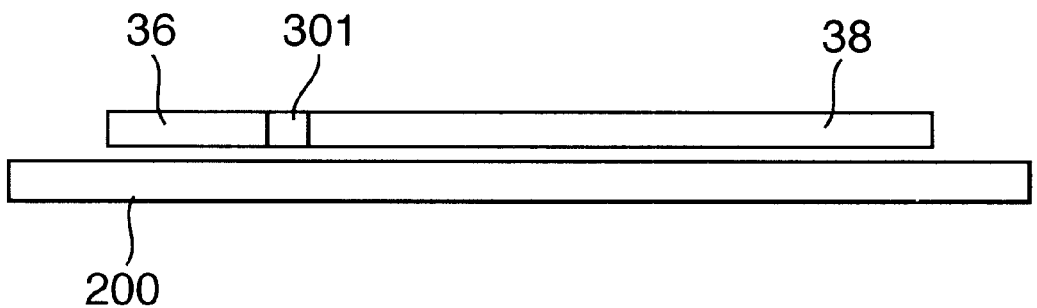
FIG. 12 shows a first cross section through an embodiment of the present invention.
Figure 13:
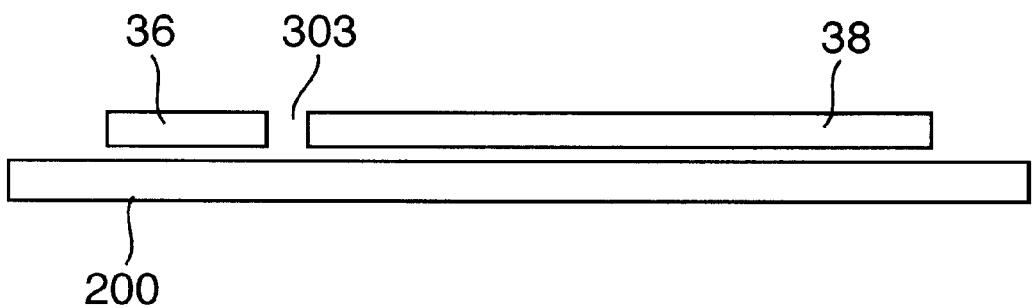
FIG. 13 shows a second cross section through an embodiment of the present invention.

So far only the term "dividing joint" has been used in the description. In general, however, any dividing arrangement whereby a plate-like analyzer element is subdivided into conducting and non-conducting regions is suitable. FIGS. 12 through 14 illustrate the various possibilities of dividing structures. Each shows a cross section through sides 36 and 38 of the detection medium corresponding to line X—X in FIG. 6. If plate-like detection medium 36, 38 is formed from a semiconducting material, preferably silicon, the dividing structure is formed by regions of low doping 301 (FIG. 12). If the plate-like detection medium is formed from a material that is a good conductor, preferably doped silicon or a metal, the dividing structure is formed by a dividing joint in the form of an air gap 303 (FIG. 13).

What is claimed is:

1. A sensor element, comprising:
   a substrate;
   at least two torsion bars;
   a plate-like detection medium arranged above the substrate and suspended by the at least two torsion bars, wherein:
      the plate-like detection medium is formed from one of a conducting material and a semiconducting material,
      the plate-like detection medium includes a conductor loop, and
      a bending of the at least two torsion bars is capable of being induced via a Lorenz force acting on the conductor loop by applying a magnetic field to the plate-like detection medium and a potential difference to the conductor loop; and
   a plurality of dividing structures for providing an electric insulation for parts of the plate-like detection medium such that the conductor loop is formed from the plate-like detection medium.

2. The sensor element according to claim 1, wherein the plate-like detection medium is formed from one of a metal and a doped silicon.

3. The sensor element according to claim 1, wherein:
   the plate-like detection medium is formed from one of a doped silicon and a metal, and
   at least one of the plurality of dividing structures is formed by a dividing joint in the form of an air gap.

4. The sensor element according to claim 1, wherein:
   the plate-like detection medium is formed from a semiconducting material, and at least one of the plurality of dividing structures is formed by regions of low doping.

5. The sensor element according to claim 4, wherein:
the semiconducting material corresponds to silicon.

6. The sensor element according to claim 1, wherein:
the plate-like detection medium is symmetrical with a torsion axis, and
the plate-like detection medium includes a bar parallel to the torsion axis to form the conductor loop.

7. The sensor element according to claim 1, further comprising:
a frame mounted on the substrate, wherein:
the plate-like detection medium is suspended over the at least two torsion bars in the frame.

8. The sensor element according to claim 1, further comprising:
a plurality of internal socket-like terminal contacts provided on the substrate, wherein:
the plate-like detection medium is suspended over the at least two torsion bars on the plurality of internal socket-like terminal contacts.

9. The sensor element according to claim 1, wherein:
the at least two torsion bars have a great depth in relation to a width thereof.

10. The sensor element according claim 7, wherein:
the frame and the at least two torsion bars are each one of made of an electrically conductive material and provided with a conductive material.

11. The sensor element according to claim 7, further comprising:
at least two electric terminal contacts, wherein:
the frame is divided into a first frame half and a second frame half, and
one of each frame half and each torsion bar is connected to a respective one of the at least two electric terminal contacts.

12. The sensor element according to claim 1, wherein:
the plate-like detection medium forms on the substrate at least two capacitors together with at least two electrodes.

13. The sensor element according to claim 12, wherein:
the at least two capacitors are interconnected into an analyzer circuit for measuring a differential capacitance between the at least two capacitors.

14. The sensor element according to claim 12, wherein:
the plate-like detection medium includes projections that function as an overload protection and prevent a short-circuiting between the at least two electrodes of the at least two capacitors.

15. The sensor element according to claim 1, wherein:
the plate-like detection medium includes at least two detection media arranged so that the at least two detection media are rotated 90° relative to one another.

16. The sensor element according to claim 1, wherein:
the sensor element is structured on a silicon wafer by a surface micromechanics operation.

17. The sensor element according to claim 15, further comprising:
an arrangement for stimulating the at least two detection media into a rotational oscillation that is close to a natural frequency of the at least two detection media.

18. The sensor element according to claim 1, wherein:
the sensor element serves as a rotational angle sensor.

19. The sensor element according to claim 1, wherein:
the sensor element serves as a magnetic field sensor.

* * * * *